United States Patent [19]

Davis

[11] 4,143,324
[45] Mar. 6, 1979

[54] TRANSISTORIZED SUPERREGENERATIVE RADIO FREQUENCY DETECTOR

[75] Inventor: Manfred Davis, Bronx, N.Y.

[73] Assignee: Transcience Industries, Inc., Stamford, Conn.

[21] Appl. No.: 688,206

[22] Filed: May 20, 1976

[51] Int. Cl.² .............................................. H04B 1/16
[52] U.S. Cl. .................................. 325/429; 325/419; 329/170; 331/174
[58] Field of Search ............... 325/429, 428, 418, 419; 331/174; 329/169, 170, 150

[56] References Cited

U.S. PATENT DOCUMENTS

| | | | |
|---|---|---|---|
| 2,501,186 | 3/1950 | Odrent | 325/428 |
| 2,526,267 | 10/1950 | Okrent | 325/428 |
| 2,584,132 | 2/1952 | Kirkman | 325/429 |
| 3,199,031 | 8/1965 | Harris et al. | 325/429 |
| 3,296,535 | 1/1967 | Murray | 325/429 |
| 3,337,807 | 8/1967 | Brown | 325/429 |
| 3,746,999 | 7/1973 | Freen | 325/429 |

Primary Examiner—Robert L. Griffin
Assistant Examiner—Tommy P. Chin
Attorney, Agent, or Firm—Martin LuKacher

[57] ABSTRACT

A transistorized superregenerative radio frequency detector which utilizes neither biasing circuits nor a base decoupling capacitor is described herein. The detector is nevertheless self-quenching and operates at a much higher quenching frequency than is the case in conventional superregenerative detectors. Simplifications are afforded over such conventional superregenerative detectors in that the number of components is reduced and the extraction of the demodulated signal as well as the stabilization of the detector is rendered more effective.

23 Claims, 3 Drawing Figures

TRANSISTORIZED SUPERREGENERATIVE RADIO FREQUENCY DETECTOR

The present invention relates to transistorized superregenerative radio frequency detector apparatus and particularly to a self-quenching transistorized superregenerative detector which does not rely on biasing circuits, grid leaks, and the like, to establish the quenching frequency and thus is substantially independent of variations in parameters of the transistor utilized therein.

The invention is especially suitable for use in U.H.F. or V.H.F. receivers for deriving audio frequency demodulation therefrom. The invention is also adapted for the detection of side band modulation.

Superregenerative detectors which have been used rely upon biasing circuits and grid leaks to develop their quenching frequencies. Such biasing makes the detector dependent upon the operating parameters of the transistor or other active device in circuit therewith. In addition, decoupling capacitors are required in order to prevent the biasing arrangements used for quenching purposes from affecting the oscillatory circuit which is tuned to the signal to be detected. The parameters of transistors are dependent upon ambient conditions, which are especially variable in portable radio applications where temperature and other parameter affecting conditions can and usually do change. Accordingly, conventional superregenerative detectors may be unstable and difficult to tune and the tuning may be different from detector to detector due to independent variations in the transistor parameters. For a discussion of conventional superregenerative detectors reference may be had to the text "Electronic Circuits and Tubes" by the Cruft Laboratory, Harvard University, McGraw-Hill Book Company, 1947, Page 744-748, and to the Radio Amateur's Handbook (1969 ED), Pages 403, 404.

It is an object of this invention to provide an improved transistorized superregenerative detector.

It is another object of the invention to provide an improved transistorized superregenerative detector which may be operated to detect signals in the U.H.F. and V.H.F. bands.

It is a further object of the present invention to provide an improved transistorized superregenerative detector which is less critical and has higher tolerance to variations in circuit parameters, particularly those of the transistor which is used therein.

It is a still further object of the present invention to provide an improved transistorized superregenerative detector which can operate over a wide tuning range without becoming unstable.

It is a still further object of the present invention to provide an improved transistorized superregenerative detector which has a higher quench frequency, thus elminating the need for chokes and other filter components which may unduly load the detector, to remove the quench frequency from the output of the detector.

It is a still further object of the invention to provide an improved transistorized superregenerative detector which may be implemented with fewer parts than is the case with previous superregenerative detectors.

It is a still further object of the present invention to provide an improved transistorized superregenerative detector which can detect signals which vary over a wide band width, say 100 KHz in the U.H.F. or the V.H.F. bands.

It is a still further object of the present invention to provide an improved transistorized superregenerative detector which is highly stable.

It is a still further object of the present invention to provide an improved superregenerative detector in which biasing and base decoupling circuits are eliminated and which nevertheless provide stable superregenerative operation.

Briefly described, superregenerative detector apparatus which embodies the invention utilizes a transistor. A resonant circuit tuned to the frequency of the signal to be detected is connected between a control electrode of the transistor, such as the base, and one of the other electrodes of the transistor, say the collector. This resonant circuit may be a parallel resonant circuit including a capacitor and an inductor. The inductor is connected directly between the base and the collector of the transistor. There are no other biasing or any base decoupling circuits utilized. A storage device such as a capacitor is connected across the collector and emitter of the transistor and operating voltage is supplied to the transistor and to the capacitor. This voltage may be applied by way of a current limiting resistor which is connected to the capacitor. A choke which provides high reactance at the signal frequency, but not at the quench frequency, may be connected to couple the quench circuit, which includes the capacitor, to the oscillatory circuit of the detector which is provided by the resonant circuit and transistor. This oscillatory circuit is tuned to the incoming signal which may be coupled thereto, as from an antenna, by means of an antenna trimmer capacitor and a coil which is coupled to the inductor of the resonant circuit.

It is believed, without intending limitation to any particular theory of operation, that the detector operates without utilizing any biasing circuitry connected to the base of the transistor by utilizing the base to emitter voltage drop therein. The transistor, due to this voltage drop, which may typically be about 0.6 volts, may permit the other electrode of the transistor to which the resonant circuit is connected to swing plus or minus 0.6 volts in an oscillatory mode before the transistor turns on (viz., becomes conductive). Thus the capacitor can discharge through the oscillatory circuit at the quench frequency and intermittently maintain oscillation therein at the signal frequency but at the quench frequency rate. The base circuit of the transistor is lightly loaded capacitively, thus permitting the quench frequency to be higher than is conventionally the case (e.g., as high as 1 MHz). The demodulated signal which appears, for example across the current limiting resistor may be extracted by means of an integrating amplifier which by virtue of its inherent capacity, say from collector to emitter, filters the quench frequency. Such amplifiers, unlike the chokes and low pass filter arrangements conventionally used in superregenerative detectors, do not load the detector and affect its operation. In addition, a DC feedback circuit may be used to stabilize the circuit. This feedback circuit may be connected from the output of the amplifiers to the transistor of the detector.

The foregoing and other objects, advantages and features of the invention will become more apparent from a reading of the following description, of presently preferred embodiments of the invention, when taken with the accompanying drawings in which.

Figure 1:
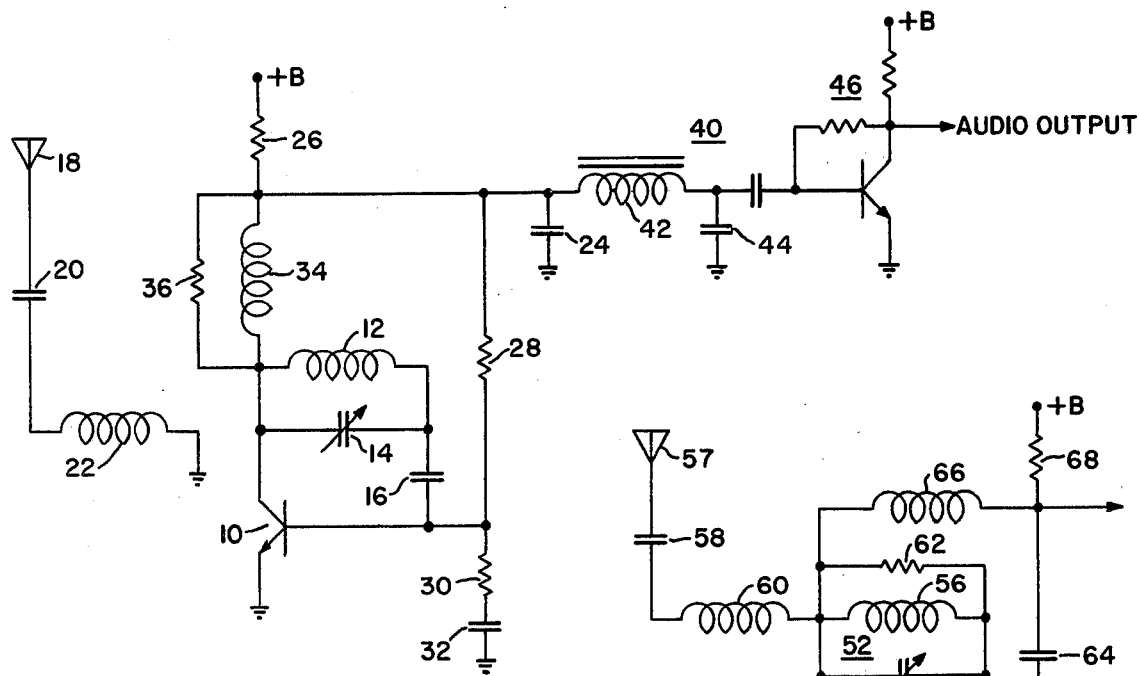
FIG. 1 is a circuit diagram illustrating a conventional type of transistorized superregenerative detector which may be considered to be prior art.

Referring first to FIG. 1, the detector shown therein includes a transistor 10 which is a bi-polar N-P-N type. An inductor 12, a capacitor 14 and a blocking capacitor 16 constitute the oscillatory circuit of the detector which may be tuned to the frequency of the signal to be detected. This signal is coupled, as from an antenna 18, through an antenna trimmer capacitor 20 and a coil 22, which may be coupled to the coil or inductor 12, into the detector circuit.

The detector is self-quenching and utilizes a quenching circuit having a capacitor 24, as the storage device. Current is supplied to the capacitor through a resistor 26 from a source of operating voltage indicated at +B. This resistor 26 acts as a current limiting device. The quenching circuit also consists of a biasing circuit including a resistor 28 and a decoupling circuit consisting of a resistor 30 and capacitor 32. The resistor 28 establishes the threshold level or bias current for the transistor 10. Consequently the blocking capacitor 16 is needed to block the voltage present on the collector from affecting the base current which is drawn by the transistor from the oscillatory circuit. The choke 34, across which a damping resistor 36 is connected, couples the quenching circuit to the oscillatory circuit. The choke 34 presents a high reactance at the signal frequency but not at the quench frequency. Thus it maintains the resistor 26 above ground at the signal frequency so that the demodulated signal (e.g., an audio output) may be extracted by means of a low pass filter 40.

This low pass filter 40 consists of a choke 42 and a capacitor 44. The audio output is amplified in an amplifier stage 46 and provided to suitable utilization circuitry. The filter 40 as well as the biasing circuit including the biasing resistor 28 and the blocking capacitor 16, the decoupling circuit 30, 32 if used, all load the transistor 10 and are dependent upon the transistor's parameters for proper operation. Since these parameters are variable, not only with ambient conditions but from transistor to transistor, the circuit may be unstable and is difficult to tune and adjust.

Figure 2:
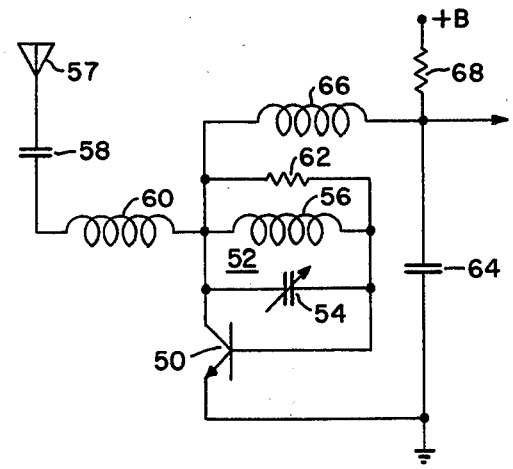
FIG. 2 is a circuit diagram of the transistorized superregenerative detector apparatus in accordance with an embodiment of the invention.

The improved transistorized superregenerative detector apparatus as shown in FIG. 2 eliminates the biasing circuit and the decoupling capacitor. It is believed that the energy stored in the capacitor of the quenching circuit is extracted by the oscillatory circuit when the transistor circuit breaks into oscillation at the R.F. frequency. The circuit operates at a quench frequency, which is much higher than obtainable in the circuit shown in FIG. 1 and in other conventional superregenerative detectors, since a biasing circuit and the transistor do not load the storage capacitor, and increase the time constant of the quenching circuit, so as to reduce the quench frequency.

More specifically, the circuit shown in FIG. 2 includes a transistor 50, a bi-polar N-P-N transistor being shown. An oscillatory circuit in the form of a parallel resonant or tank circuit 52, is also provided. This circuit 52 consists of a tuning capacitor 54 and an inductor 56. The inductor 56 is connected directly between the collector and the base and provides a direct current path therebetween. The input signals, as from an antenna 57, are injected into the tank circuit 52 by way of an antenna trimmer capacitor 58 and a coil 60 which is coupled to the tank circuit coil 56. A damping resistor 62 may be connected across the resonant circuit 52 in order to insure that the oscillations die down completely before the storage device provided by the capacitor 64 recharges. The capacitor 64 is connected across the transistor (viz., between collector and emitter). This connection may be through a choke 66 which serves as a coupling device for the quench current while decoupling the signal frequency to which the oscillatory circuit is tuned. The signal is developed across a resistor 68, which acts as a current limiting resistor, through which the capacitor 64 charges. The output (e.g., an audio signal) is also present across the resistor 68.

It is believed that the base to emitter voltage drop in the transistor 50 permits the collector of the transistor 50 to swing by the amount of this voltage drop to establish the peak to peak collector voltage swing during the period of oscillation. The swings occur at the R.F. signal frequency (the frequency to which the resonant circuit 52 is tuned). The capacitor 64 is thus discharged during the oscillations of the circuit, and will charge back up to the turn on voltage of the base. Because of the low resistance in the discharge path, the quench frequency may be very high, say about 1 MHz. The current drawn through the transistor 50 is quite limited, thus the transistor parameters do not have as a significant affect on the circuit operation as is the case in the circuit shown in FIG. 1 or elsewhere in the known prior art.

The quench frequency as well as the demodulated signal appears across the resistor 68. This quench frequency may be removed by means of low pass filters as is the case in the prior art. However, inasmuch as the quench frequency is much higher, active filters may also be used, with the further advantage that their high input impedance further serves to reduce the loading on the transistorized superregenerative detector.

Figure 3:
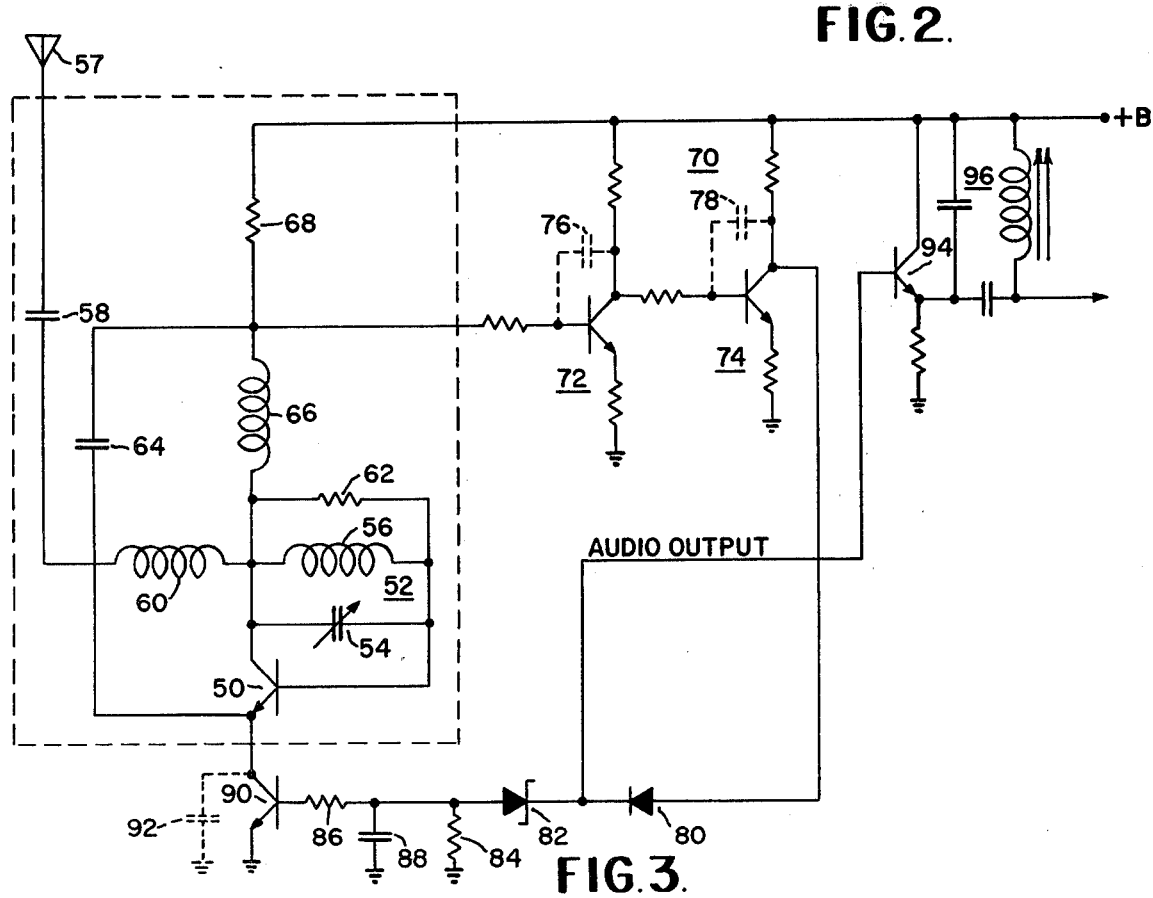
FIG. 3 is a schematic diagram illustrating superregenerative detector apparatus embodying circuitry similar to that shown in FIG. 2 and which also contains additional circuitry for extracting the demodulated signal and the stabilization of the detector.

Transistorized superregenerative detector apparatus which utilizes such active filters as well as direct current stabilization circuits which provide for detection of signals having an extremely wide bandwidth, say 100 KHz in the V.H.F. or the U.H.F. band, is shown in FIG. 3. The transistorized superregenerative detector circuit used in the apparatus of FIG. 3 is similar to the circuit shown in FIG. 2, it is enclosed within dash lines, and like parts are identified with like reference numerals. The demodulated signal is extracted by an active filter 70 provided by two tandem connected common emitter transistor amplifier stages 72 and 74. These stages have high gain and are integrating amplifiers by virtue of the capacitive feedback due to the inherent collector to base capacitance 76, 78 thereof. The dash lines showing the capacitances 76 and 78 denotes that these capacitances are internal to the transistors.

A direct current feedback circuit is utilized to stabilize the high gain of the amplifier stages 72 and 74. This feedback circuit includes a diode 80, a voltage limiting zener diode 82 and a low pass filter consisting of resistors 84 and 86 and a shunt capacitor 88. The feedback path is completed through a transistor 90, the collector to emitter path thereof is connected in series with the collector to emitter path of the transistor 50. The internal capacitance 92 between collector and emitter of the transistor 90 also maintains the gain at higher audio frequencies. The audio output is obtained from the output of the amplifier stages 70 but limited in amplitude by the diode 80. This is an especially suitable configuration where the audio output is detected in a tuned circuit since the acceptance bandwidth will not vary with signal strength. The signal may be detected after amplification in a typical transistor amplifier 94 across which is connected a tank circuit 96 tuned to the center frequency of the audio signal. If the audio signal is Frequency Modulated, an F.M. detector circuit would be substituted for the single tuned circuit. Other detection and utilization techniques are shown (e.g.) in Gram, U.S. Pat. No. 3,665,475.

From the foregoing description it will be apparent that there has been provided improved transistorized superregenerative detector apparatus. While embodiments of such apparatus which are presently preferred have been described, it will be appreciated that variations and modifications thereof within the scope of the invention may suggest themselves to those skilled in the art. Accordingly, the foregoing description should be taken merely as illustrative and not in any limiting sense.

What is claimed is:

1. Superregenerative detector apparatus which comprises
    (a) an oscillatory circuit tuned to the frequency of the signals to be detected, said circuit comprising
        (i) a transistor having a base, a collector and an emitter,
        (ii) a circuit including a resonant circuit providing the only direct current path to said base, said resonant circuit being connected between said base and said collector,
    (b) a quenching circuit comprising
        (i) means including a capacitor for establishing a quench frequency,
        (ii) means connecting said capacitor between the collector and emitter of said transistor,
        (iii) means for applying operating voltage to said capacitor,
        (iv) said capacitor supplying current to said oscillatory circuit until the voltage at said base reaches the turn on voltage of said transistor thereby establishing the quench frequency of said circuit without additional biasing means connected to said base.

2. The invention as set forth in claim 1 wherein said transistor is a bi-polar transistor.

3. The invention as set forth in claim 2 wherein said transistor is of the N-P-N type.

4. The invention as set forth in claim 1 wherein said resonant circuit is a parallel resonant circuit having a capacitor and an inductor, said inductor being connected directly between said base and said collector to provide said direct current path.

5. The invention as set forth in claim 4 wherein said circuit including a resistor connected across said parallel resonant circuit to provide for damping of the oscillations therein before said quenching circuit capacitor charges upon the next cycle of said quench frequency.

6. The invention as set forth in claim 4 wherein said means for applying operating voltage to said quenching circuit capacitor is a resistor connected between said capacitor and a source of operating voltage.

7. The invention as set forth in claim 6 further comprising means connected to said last-named resistor for deriving demodulated signals from said detector apparatus.

8. The invention as set forth in claim 6 wherein said means connecting said quenching circuit capacitor between the collector and emitter of said transistor is a choke at the frequency of said signals to be detected, said choke being connected between the junction of said quenching circuit capacitor and said last-named resistor and said collector.

9. The invention as set forth in claim 4 further comprising circuit means for feeding the signal demodulated by said oscillatory circuit back thereto.

10. The invention as set forth in claim 9 wherein said circuit means is a direct current feedback circuit.

11. The invention as set forth in claim 10 wherein said feedback circuit includes a second transistor having a collector emitter path connected to said emitter, and amplifier means responsive to the demodulated signal from said detector apparatus for applying said demodulated signal to said second transistor.

12. The invention as set forth in claim 11 wherein said means for applying operating voltage to said quenching circuit capacitor is a resistor connected between said quenching circuit capacitor and a source of operating voltage, and said means for connecting said capacitor between said collector and said emitter of said oscillatory circuit transistor is a choke at the frequency of the signals to be detected, said choke being connected between said last-named resistor and said collector of said oscillatory circuit transistor, said amplifier means being input connected to the junction of said choke and said resistor.

13. The invention as set forth in claim 11 wherein said amplifier means includes filter means for blocking signals at and above said quench frequency.

14. Superregenerative detector apparatus which comprises
    (a) a transistor having a control electrode and a first and a second electrodes,
    (b) a resonant circuit including a capacitor and an inductor tuned to the frequency of the signal to be detected,
    (c) a circuit including said resonant circuit providing the only direct current path to said control electrode,
    (d) said inductor being connected directly between said control electrode and said first electrode, and
    (e) a quench capacitor which supplies current to said resonant circuit at a quench frequency connected in a circuit which includes said first and second electrodes,
    (f) wherein said quench frequency of said detector apparatus is established without additional biasing means connected to said control electrode.

15. The invention as set forth in claim 14 wherein said energy storage device is a second capacitor which supplies current to said resonant circuit at a quench frequency.

16. The invention as set forth in claim 15 wherein said transistor is a bipolar transistor having a base, as said control electrode, and a collector and an emitter as said other electrodes, said resonant circuit being connected between the collector and base thereof.

17. The invention as set forth in claim 16 including a second inductor coupled to said first named inductor for coupling said first inductor to an antenna.

18. The invention as set forth in claim 17 including a third capacitor connecting said second inductor to said antenna.

19. The invention as set forth in claim 16 including an output resistor and a second inductor connected in series between said collector and a source of operating voltage, said second capacitor being connected between the junction of said output resistor and said inductor and said emitter.

20. The invention as set forth in claim 19 including an active low pass filter for passing the signal demodulated by said detector, said filter being input connected to the junction of said output resistor and said second inductor.

21. The invention as set forth in claim 20 wherein said active filter comprises a common emitter transistor amplifier having base to collector internal capacitance providing feedback for active low pass filter operation.

22. The invention as set forth in claim 21 further comprising a direct current feedback circuit between the output of said common emitter amplifier and said first named transistor.

23. The invention as set forth in claim 22 wherein said feedback circuit comprises a second transistor having a collector emitter path connected to the emitter of said first named transistor, and a low pass filter connected between the base of said second transistor and the output of said common emitter amplifier.

* * * * *